United States Patent
Nagayama et al.

(10) Patent No.: US 8,739,732 B2
(45) Date of Patent: Jun. 3, 2014

(54) PLASMA TREATMENT CONTAINER INTERNAL MEMBER, AND PLASMA TREATMENT APPARATUS HAVING THE PLASMA TREATMENT CONTAINER INTERNAL MEMBER

(75) Inventors: Nobuyuki Nagayama, Yamanashi (JP); Hiroyuki Nakayama, Yamanashi (JP); Kouji Mitsuhashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1116 days.

(21) Appl. No.: 10/477,759

(22) PCT Filed: May 17, 2002

(86) PCT No.: PCT/JP02/04801
§ 371 (c)(1),
(2), (4) Date: Nov. 25, 2003

(87) PCT Pub. No.: WO02/097154
PCT Pub. Date: Dec. 5, 2002

(65) Prior Publication Data
US 2004/0144319 A1    Jul. 29, 2004

(30) Foreign Application Priority Data
May 25, 2001   (JP) .................................. 2001-157510

(51) Int. Cl.
*C23C 16/00* (2006.01)
*H01L 21/306* (2006.01)

(52) U.S. Cl.
USPC ............... 118/723 R; 118/723 E; 156/345.47

(58) Field of Classification Search
USPC ......... 118/723 E, 723 ER, 723 R; 156/345.47
See application file for complete search history.

(56) References Cited

U.S. PATENT DOCUMENTS 5,225,069 A * 7/1993 Haupt et al. .................. 205/325
5,385,662 A   1/1995 Kurze et al. .................... 205/316

FOREIGN PATENT DOCUMENTS

| JP | 58-34176 | 2/1983 |
| JP | 1-309979 | 12/1989 |
| JP | 06-306644 | 11/1994 |
| JP | 2000-114189 | * 4/2000 |
| JP | 2001-31484 | 2/2001 |

* cited by examiner

*Primary Examiner* — Luz Alejandro Mulero
(74) *Attorney, Agent, or Firm* — Rothwell, Figg, Ernst & Manbeck, P.C.

(57) ABSTRACT

A plasma treatment container internal member, which is used in a plasma treatment container for performing a process on an object to be treated by plasma, includes an anodic oxide coating formed on a surface of a base material of the plasma treatment container internal member by an anodic oxidation treatment using plasma discharge, and a thermally sprayed film formed on the anodic oxide coating. The anodic oxidation treatment includes immersing the base material in an alkaline organic solvent, and performing the plasma discharge in the alkaline organic solvent.

26 Claims, 6 Drawing Sheets

⇩ ANODIC OXIDATION TREATMENT

⇩ BLAST TREATMENT

⇩ PLASMA THERMAL SPRAY TREATMENT

PLASMA TREATMENT CONTAINER INTERNAL MEMBER, AND PLASMA TREATMENT APPARATUS HAVING THE PLASMA TREATMENT CONTAINER INTERNAL MEMBER

FIELD OF THE INVENTION

The present invention relates to a plasma treatment container internal member and a plasma treatment apparatus having the plasma treatment container internal member; and more particularly, to a plasma treatment container internal member in a plasma treatment container of a plasma treatment apparatus for processing an object to be treated, such as a semiconductor wafer, by plasma, and a plasma treatment apparatus having such plasma treatment container internal member.

BACKGROUND OF THE INVENTION

Conventionally, a process, such as etching processing performed on an object to be treated, e.g., a semiconductor wafer, is carried out by a plasma etching apparatus under a low temperature, high rate and dry condition.

FIG. 5 is a cross sectional view showing internal structure of a plasma etching apparatus.

As shown in FIG. 5, a plasma treatment container 1 of the plasma etching apparatus includes a processing chamber 2 therein and an upper electrode 3 made of conductive material is disposed at a top portion thereof. In the processing chamber 2, a lower electrode 4 made of a conductive material is disposed to face the upper electrode 3, and a semiconductor wafer 6, the object to be treated, is adsorbed to be held on an upper surface of the lower electrode 4 through an electrostatic chuck 5. Along a circumference of the container 1, a permanent magnet 7 is disposed in such a manner that its magnetic field is parallel with the semiconductor wafer 6, the object to be treated.

The upper electrode 3 is provided with a plurality of gas discharge openings 8 through which a processing gas including fluoride such as $CF_4$ and $NF_3$, chloride of $BCl_3$, $SnCl_4$ and the like, and bromide such as HBr is supplied to the processing chamber 2.

Further, the lower electrode 4 is supported by an elevating column 9 which can be lifted and lowered by a driving device along a direction indicated by an arrow A, and is connected to a high frequency power supply through a matching unit. Bottom and side surfaces of the lower electrode 4 are protected by an electrode protection member 10 while bottom and side surfaces of the electrode protection member 10 are covered with a conductive member 11. Disposed between the conductive member 11 and a bottom of the container 1 is an expandable and contractible bellows 12 made of a conductive material such as stainless steel.

Disposed beneath the bottom surface of the electrode protecting member 10 is a tubular member 13 made of a conductive material into which the elevating column 9 is inserted to penetrate therethrough. And fixedly attached on the side surface of the electrode protection member 10 is an exhaust ring 14 of a flange shape. Further, an insulation ring 15 is disposed between an end surface of the electrode protecting member 10 and a side surface of the electrostatic chuck 5. Disposed below a lower surface of the exhaust ring 14 is a bellows cover 16 which is extended downwards therefrom. And vertically disposed on the bottom surface of the container 1 is a bellows cover 17 in such a manner that it overlaps with a portion of the bellows cover 16.

In the container 1 arranged as described above, after a position of the semiconductor wafer 6 is adjusted by moving the elevating column 9 along the direction of the arrow A, a high frequency power is supplied from the high frequency power supply to the lower electrode 4 through the elevating column 9 functioning as a power supply rod. Then, the processing gas introduced into the processing chamber 2 depressurized to a predetermined vacuum ambience is transformed into plasma, so that a desired process is performed on the masked semiconductor wafer 6 by a plasma etching.

In the course of plasma etching process, plasma treatment container internal members, such as the electrode protection member 10, the tubular member 13, the exhaust ring 14, the insulation ring 15 and the bellows covers 16 and 17, are severely damaged by the processing gas transformed into the plasma, i.e., by the so-called plasma erosion. Thus, plasma-resistant material is used therefor.

Among these plasma treatment container internal members, the ones whose base material is Al, Al alloy, aluminum oxide and the like are rendered plasma-resistant by forming an oxide film (alumite film) on a surface of the base material. Further, in a case where abundant halogen and oxygen gases are used in order to increase effectiveness of the plasma etching processing, lifetime of the alumite film on a surface of the plasma treatment container is shortened. Thus, there has been suggested a method for manufacturing a more plasma-resistant plasma treatment container internal member by forming a thermally sprayed film made of $Y_2O_3$ on a surface of the base material (see, for example, Japanese Patent Application No. 1999-351546.

As shown in FIGS. 6A to 6D, this method includes the steps of preparing a base material 601 with a surface treated by machining (FIG. 6A); forming an alumite film 602 on a surface of the base material 601 by an anodic oxidation treatment (FIG. 6B); next, performing a blast treatment of spraying $Al_2O_3$, SiC, sand and the like on the alumite film 602 (FIG. 6C); and then, forming a thermally sprayed film 603 by a plasma thermal spray treatment (FIG. 6D).

In the aforementioned method, the blast treatment is performed because roughening the surface by spraying $Al_2O_3$, SiC, sand and the like increases adhesivity of the thermally sprayed film 603 formed of $Y_2O_3$ serving as a plasma-resistant material to the alumite film 602.

Since, however, a blasting direction of $Al_2O_3$, SiC, sand and the like is straight, the blasting treatment only can be performed on a simple surface, and a quantitative treatment cannot be performed on shaded regions, such as sidewalls of a slit and a hole.

Further, in case of the base material 601 (FIG. 6B) treated by anodic oxidation, significant increase in adhesion of the thermally spayed film 603 cannot be achieved.

Therefore, in the course of $CO_2$ blasting carried out by blowing a dry ice to clean the plasma treatment container internal member, the thermally sprayed film 603 is often peeled off.

An object of the present invention is to provide a plasma treatment container internal member capable of improving adhesivity of a thermally sprayed film to a surface of a base material thereof and a plasma treatment apparatus having the plasma treatment container internal member.

SUMMARY OF THE INVENTION

To achieve the above object, a plasma treatment container internal member disposed in a plasma treatment container for performing processing on an object to be treated by plasma includes an anodic oxide coating formed on a surface of a base material of the plasma treatment container internal member by anodic oxidation treatment using plasma discharge; and a thermally sprayed film formed on the anodic oxide coating.

It is preferable that the thermally sprayed film is formed of $Al_2O_3$.

It is more preferable that the thermally sprayed film is formed of a compound of a Group 3A element.

It is preferable that the compound of the Group 3A element is $Y_2O_3$.

It is preferable that the base material is formed of an Al alloy and subjected to a blast treatment as a pre-treatment.

To achieve the above object, a plasma treatment apparatus includes the plasma treatment container internal member.

BRIEF DESCRIPTION OF THE DRAWINGS

FIGS. 1A to 1C are diagrams illustrating a method for manufacturing a plasma treatment container internal member in accordance with an embodiment of the present invention, wherein FIG. 1A shows an initial manufacturing stage; FIG. 1B is a step of performing a Kepla-Coat treatment; and FIG. 1C depicts a step of performing a plasma thermal spray treatment.

FIGS. 6A to 6D disclose diagrams illustrating a method for manufacturing a conventional plasma treatment container internal member, wherein FIG. 6A shows an initial manufacturing stage; FIG. 6B is a step of an anodic oxidation treatment; FIG. 6C is a step of a blast treatment; and FIG. 6D is a step of a plasma thermal spray treatment.

DETAILED DESCRIPTION OF THE PREFERRED EMBODIMENTS

As a result of careful study for achieving the above object, the inventors of the present invention found that, in a plasma treatment container internal member disposed in a plasma treatment apparatus for performing processing on an object to be treated by plasma, if a thermally sprayed film is formed after performing, as a pre-treatment, an anodic oxidation treatment using plasma discharge on a surface of a base material of the plasma treatment container internal member, adhesivity of the thermally sprayed film to the surface of the base material can be improved because the pre-treatment was uniformly performed regardless of a shape of the base material.

Further, the inventors of the present invention found that if the thermally sprayed film is formed of Al203 and a Group 3A compound such as $Y_2O_3$ and the like, plasma-resistance of the plasma treatment container internal member can be improved.

Further, the inventors of the present invention found that if the base material is formed of an Al alloy and the blast treatment is performed on the base material as a pre-treatment, the stable thermally sprayed film can be formed.

A method for manufacturing the plasma treatment container internal member in accordance with an embodiment of the present invention will now be described.

Figure 1A:
Figure 1B:
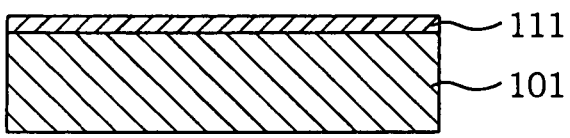
Figure 1C:
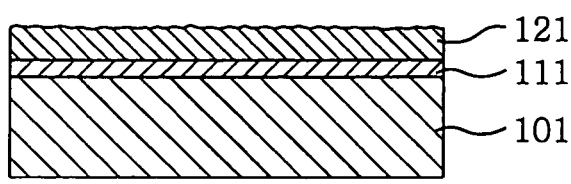

FIGS. 1A to 1C illustrate the method for manufacturing a plasma treatment container internal member in accordance with the embodiment of the present invention, wherein FIG. 1A is an initial manufacturing stage; FIG. 1B is a step of performing a Kepla-Coat treatment; and FIG. 1C is a step of performing a plasma thermal spray treatment.

Figure 2:
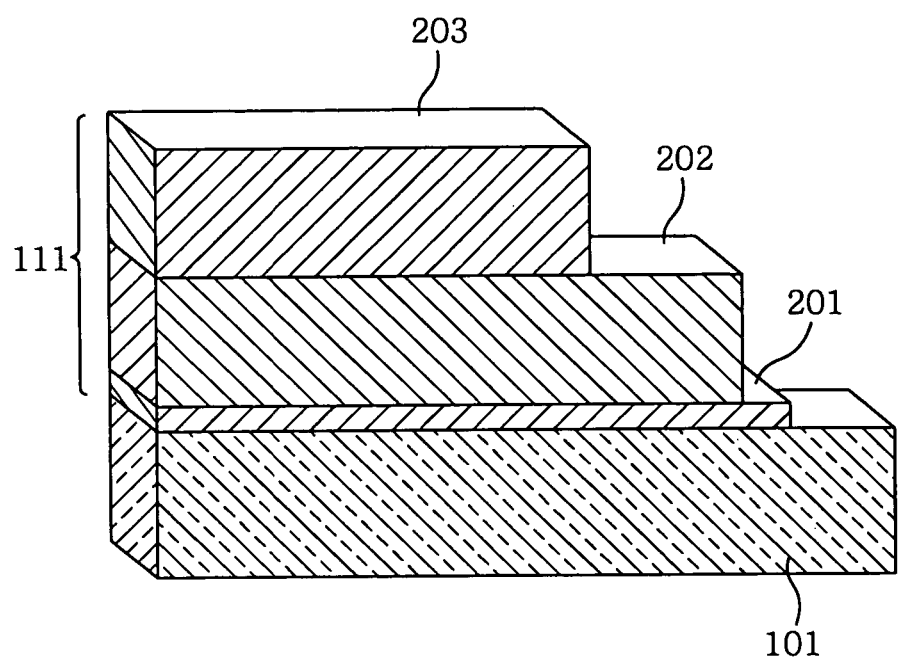
FIG. 2 represents a schematic view of a base material 101 on which the Kepla-Coat treatment is performed.

As shown in Figs. 1A to 1C, a Kepla-Coat layer 111 to be described later in FIG. 2 is formed on a surface of the base material 101 of the plasma treatment container internal member (FIG. 1A) by performing the Kepla-Coat treatment (KEPLA-COAT:registered trade mark) on the base material 101 (FIG. 1B). This leads to an improvement in adhesion of a thermally sprayed film 121 formed on the base material 101.

The Kepla-Coat treatment is an anodic oxidation treatment using plasma discharge by a liquid chemical, in which the Kepla-Coat layer 111 is formed on the surface of the base material 101 by immersing the base material 101 in an alkali organic electrolyte and the like to serve as an anode and then discharging oxygen plasma in the alkali organic electrolyte.

Next, the thermally sprayed film 121 is formed on the Kepla-Coat layer 111 by performing the plasma thermal spray treatment on the Kepla-Coat layer 111 (FIG. 1C) by employing a thermally sprayed film forming device to be described later in FIG. 3.

Further, it may be preferable that a blast treatment of blasting $Al_2O_3$, SiC, sand and the like on the surface of the base material 101 is carried out before performing the Kepla-Coat treatment.

FIG. 2 is a schematic view of the base material 101 on which the Kepla-Coat treatment is performed.

As shown in FIG. 2, if the Kepla-Coat treatment is performed on the surface of the base material 101, the Kepla-Coat layer 111 is formed on a surface thereof, which is composed of a barrier layer 201 equal to or less than 100 nm in thickness, a low porosity ceramic layer 202 and a high porosity ceramic layer 203. The Kepla-Coat layer 111 is formed uniformly on edge portions, holes, recessed and protruded portions, and the like of the plasma treatment container internal member.

Since the Kepla-Coat treatment is a treatment performed by the liquid chemical, it is more effective as the pre-treatment performed to improve the adhesivity compared with the blast treatment. Therefore, the pre-treatment can be performed uniformly even in a case where the surface of the base material 101 is configured in such a manner that $Al_2O_3$, SiC, sand and the like cannot be blasted. Thus, in a case where the Kepla-Coat treatment is performed, the blast treatment need not necessarily be performed.

Further, it is preferable that the Kepla-Coat layer 111 measures from about 10 to 50 μm in thickness. Such a Kepla-Coat layer 111 can certainly prevent exposure of the base material 101 caused by the peeling-off of the thermally sprayed film 121.

Figure 3:
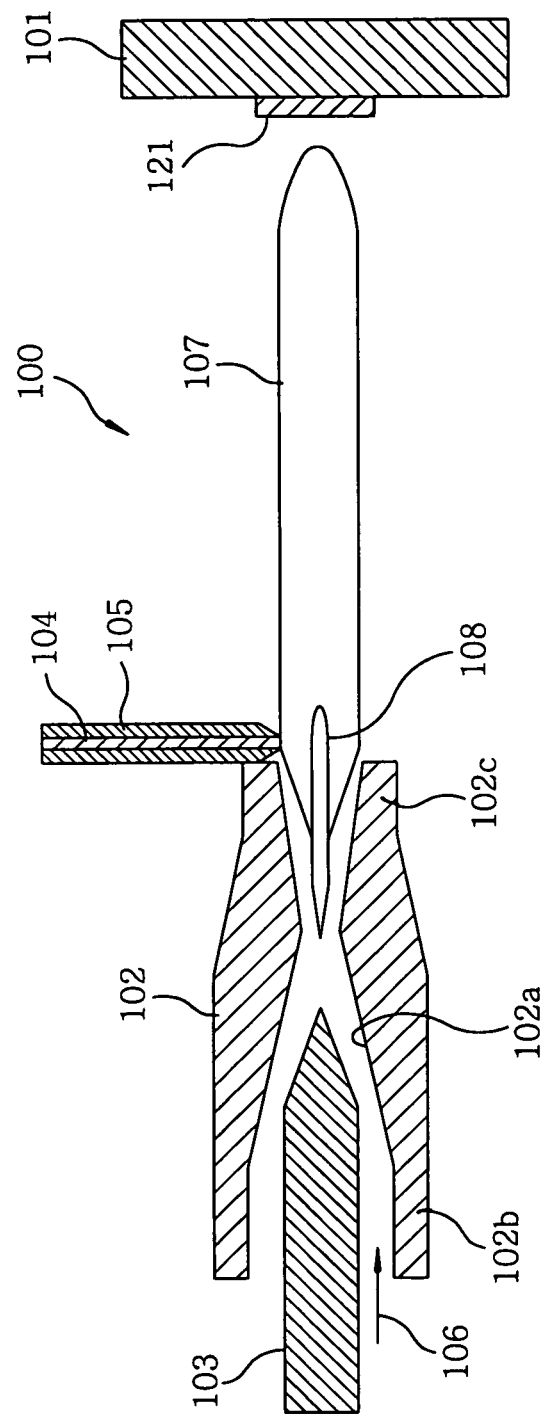
FIG. 3 presents a view showing a schematic arrangement of a thermally sprayed film forming device for use in performing the plasma thermal spray treatment.

FIG. 3 is a view showing a schematic arrangement of a thermally sprayed film forming device for use in performing the plasma thermal spray treatment.

As shown in FIG. 3, a thermally sprayed film forming device 100 includes an anode 102 with a venturi type through hole 102a horizontally disposed toward the base material 101 made of an Al alloy; a cathode 103 horizontally inserted into the through hole 102a from an inlet 102b of the anode 102; and a thermal spray powder introducing port 105 disposed perpendicular to an outlet 102c of the anode 102 to supply thermal spray powder 104, which is a source material for the thermally sprayed film 121, to the outlet 102c of the anode 102.

When an operation gas 106 having Ar, He, N or the like is introduced into the through hole 102a from the inlet 102b of the anode 102, a certain voltage is applied between the anode 102 and the cathode 103, so that arc takes place between the anode 102 and the cathode 103 and the operation gas 106 is heated to a high temperature to be ionized and transformed into plasma 108. The plasma 108 emits tremendous heat and expands upon reverting to its original state, so that a plasma jet 107 at a temperature of several tens of thousands degrees Celsius is formed due to acceleration by jetted air.

When the thermal spray powder from the thermal spray powder introducing port 105 is supplied to the plasma jet 107 at the outlet 102c of the anode 102, the thermal spray powder 104 is melted or half melted and then collides with the base material 101 to form the dense thermally sprayed film 121 on the surface of the base material 101.

It is preferred that the thermal spray powder 104 supplied from the thermal spray powder introducing port 105 disposed in the aforementioned thermally sprayed film forming device 100 is formed of $Al_2O_3$ or a Group 3 compound, such as $Y_2O_3$ or the like, thereby enabling to improve the plasma resistance of the base material 101.

Further, it is preferable that the thickness of the thermally sprayed film 121 formed on the surface of the base material 101 ranges from 50 to 200 μm, by which the plasma resistance of the base material 101 can be surely improved.

Embodiments of the present invention will be described in detail hereinafter.

First, the blast treatment, the Kepla-Coat treatment and the plasma thermal spray treatment were performed in that order on surfaces of test pieces as for examples of the embodiments under a condition specified below (embodiments 1 to 3).

[Fabrication Condition]
test piece configuration: Φ25×40 mm
grade of blast material: #60, #120
thickness of the Kepla-Coat layer formed by the Kepla-Coat treatment: 10 μm
thermal spray powder material: $Al_2O_3$, $Y_2O_3$
thickness of the thermally sprayed film: 200 μm With regard to the blast treatment, a test piece of the embodiment 1 was not subjected thereto, but respective test pieces of the embodiments 2 and 3 were subjected thereto by using the blast materials of #60 and #120 respectively. The material of the thermally sprayed films for the test pieces of the embodiments 1 to 3 was $Al_2O_3$.

Further, in order to improve the plasma resistance, an anodic oxidation treatment for forming alumite film, the blast treatment and the plasma thermal spray treatment were performed in that order on surfaces of the test pieces of comparative examples under a same condition as mentioned above (comparative examples 1 to 4). The comparative examples 5 and 6 were subjected to the plasma thermal spray treatment without any surface treatment.

As for the anodic oxidation treatment, the respective test pieces of the comparative examples 1 and 2 were not subjected thereto, but the respective test pieces of the comparative examples 3 and 4 were subjected thereto.

With regard to the blast treatment, surfaces of the respective test pieces of the comparative examples 1, 3 and 4 were subjected thereto with the blast material of #60, and a surface of the test piece of the comparative example 2 was subjected thereto with the blast material of #120.

The thermally sprayed film material for the test pieces of the comparative examples 1, 2, 3 and 5 was $Al_2O_3$, and that for the test pieces of the comparative examples 4 and 6 was $Y_2O_3$.

Adhesions of the thermally sprayed films formed on the test pieces of the embodiments 1 to 3 and the comparative examples 1 to 6 having the thermally sprayed films formed as mentioned above were obtained in accordance with a test defined in JISH8666 described below.

Figure 4:
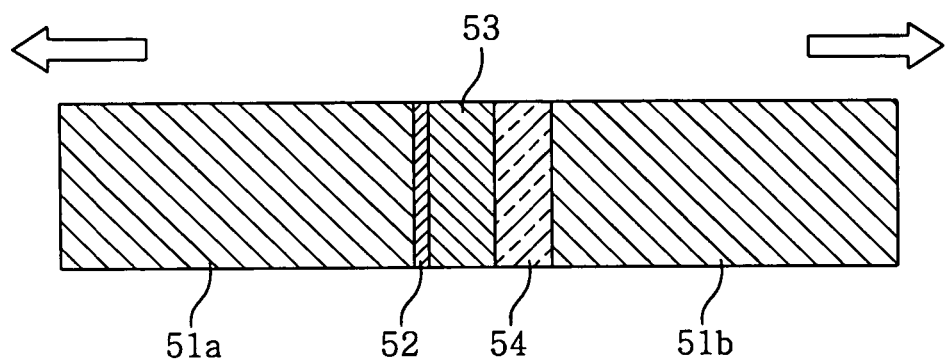
FIG. 4 sets forth a diagram illustrating a method for measuring the adhesion of the thermally sprayed film in accordance with the test defined in JISH8666.
Figure 5:
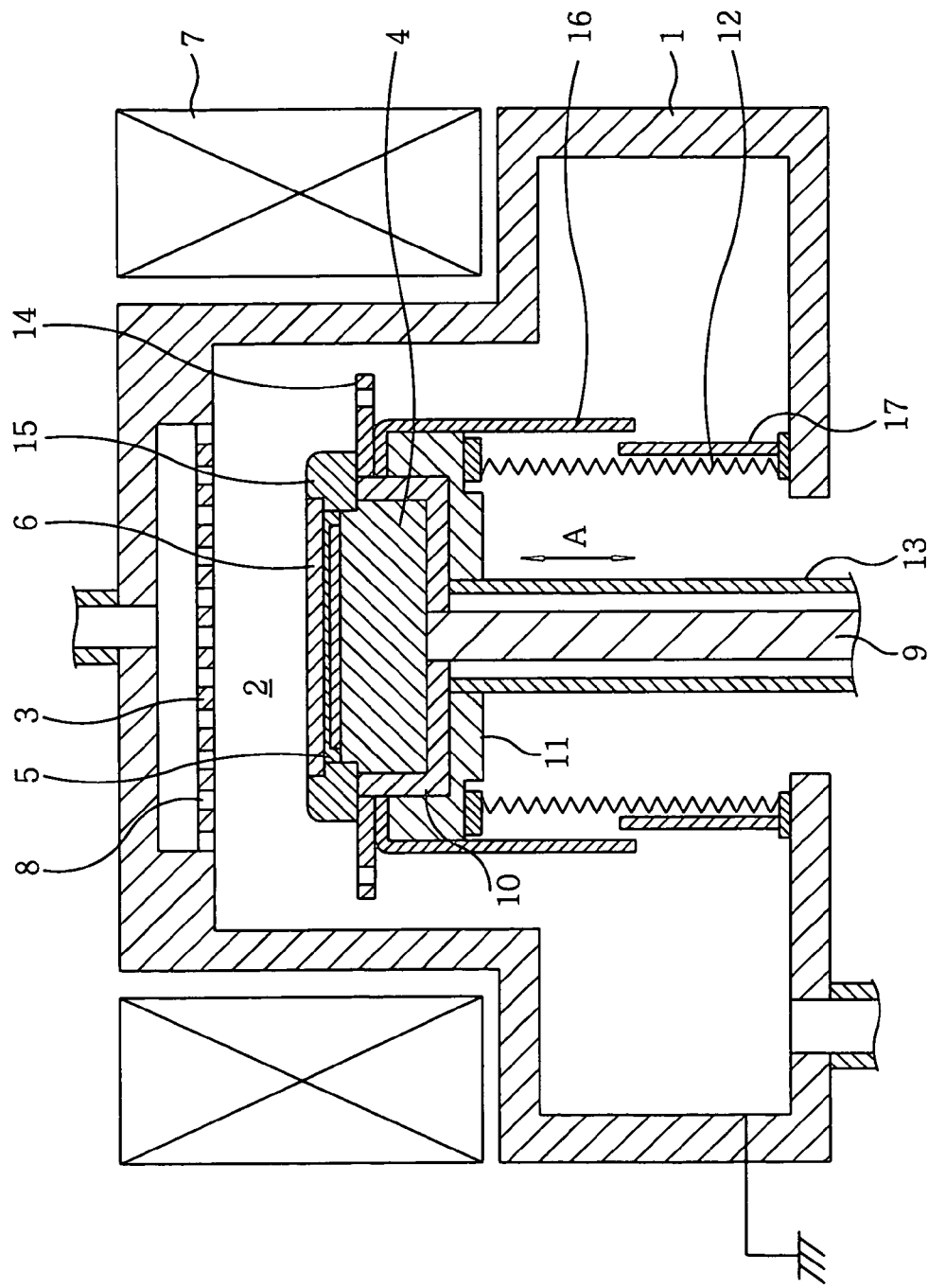
FIG. 5 outlines a cross. sectional view showing internal structure of a plasma etching apparatus.
Figure 6A:
Figure 6B:
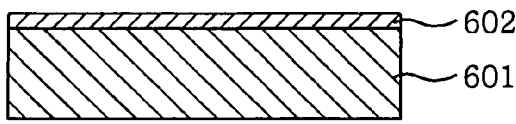
Figure 6C:
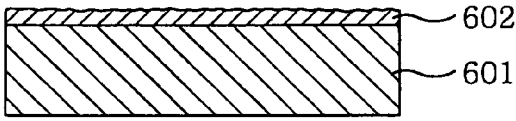
Figure 6D:
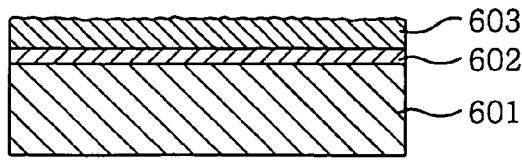

FIG. 4 is a diagram illustrating a method for measuring the adhesion of the thermally sprayed film in accordance with the test defined in JISH8666.

As shown in FIG. 4, test pieces 51a and 51b formed of an Al alloy used as a material of the base material 101, a pre-treated portion 52 pre-treated on a surface of the test piece 51a, a thermally sprayed film 53 formed on the pre-treated portion 52 and a high temperature hardening type epoxy-based adhesive 54 for sticking the test piece 51b to a surface of the thermally sprayed film 53 are used for the measurement of the adhesion of the thermally sprayed film.

First, the test piece 51a on which the pre-treated portion 52 and the thermally sprayed film 53 are formed is bonded to the test piece 51b by the epoxy-based adhesive 54.

Next, the test pieces 51a and 51b bonded to each other are pulled in directions of arrows by a tension tester, and a breaking load applied to the test pieces 51a and 51b when the test pieces 51a and 51b are being detached is determined as the adhesion of the thermally sprayed film 53.

In Table 1, there are indicated the pre-treatment methods and the thermal spray powder materials of the embodiments 1 to 3 and the comparative examples 1 to 6; adhesions of the thermally sprayed films 53 formed on the test pieces of the embodiments 1 to 3 and the comparative examples 1 to 6; and state of fracture surfaces after the JISH8666 test.

TABLE 1

| | | | SURFACE TREATMENT | THERMALLY SPRAYED FILM | ADHESION (MPa) | FRACTURE SURFACE |
|---|---|---|---|---|---|---|
| EMBODIMENT | | 1 | Kepla-Coat treatment | $Al_2O_3$ | above measurement limit | Adhesive |
| | | 2 | Blast treatment (#60) + Kepla-Coat treatment | $Al_2O_3$ | above measurement limit | Adhesive |
| | | 3 | Blast treatment (#120) + Kepla-Coat treatment | $Al_2O_3$ | above measurement limit | Adhesive |
| COMPARATIVE EXAMPLE | | 1 | Blast treatment (#60) | $Al_2O_3$ | 33.5 | Thermally sprayed film |

TABLE 1-continued

| | SURFACE TREATMENT | THERMALLY SPRAYED FILM | ADHESION (MPa) | FRACTURE SURFACE |
|---|---|---|---|---|
| 2 | Blast treatment (#120) | $Al_2O_3$ | 29.9 | Thermally sprayed film |
| 3 | Anodic oxidation treatment + blast treatment (#60) | $Al_2O_3$ | 3.3 | Thermally sprayed film |
| 4 | Anodic oxidation treatment + blast treatment (#60) | $Y_2O_3$ | 3.5 | Thermally sprayed film |
| 5 | None | $Al_2O_3$ | 0.0 | Thermally sprayed film |
| 6 | None | $Y_2O_3$ | 0.0 | Thermally sprayed film |

As indicated clearly in Table 1, the fracture surfaces of the comparative examples 1 to 6 appear on the thermally sprayed film 53, so that it is confirmed that the adhesions of the thermally sprayed films 53 are lower than that of the epoxy-based adhesive 54.

Further, the adhesion values of comparative examples 1 and 2, in which the thermally sprayed films 53 were formed under the same condition whereas the pre-treatments were performed with the blast materials of #60 and #120, respectively, are 33.5 MPa and 29.9 MPa, respectively with the mere difference of 3.6 MPa. Thus, it is confirmed that surface roughness by the blast treatment rarely has any influence.

Further, it is confirmed that in case an identical blast treatment is carried out before the formation of the thermally sprayed film 53, thermally sprayed films measuring 200 µm in thickness can be formed in both of the cases where the materials thereof are $Al_2O_3$ and the conventionally used material $Y_2O_3$ (comparative example 4).

Further, the adhesion values of the comparative examples 3 and 4 are 3.3 MPa and 3.5 MPa, respectively with the mere difference of 0.2 Mpa. Thus, it is confirmed that the material of the thermally sprayed film 53 rarely has any influence.

On the other hand, the fracture surfaces of the embodiments 1 to 3 are portions covered with the adhesive. From this, it is confirmed that the adhesion of the thermally sprayed film 53 is greater than adhesive strength of the epoxy-based adhesive 54. Further, according to measurement results of their adhesions, all the adhesion values of the embodiments 1 to 3 are greater than a measurement limit (about 40 MPa), and thus it is confirmed that their adhesions are greater than ten times those of the thermally sprayed films formed on the base material 101 subjected to the anodic oxidation treatment and then the blast treatment. This is based on the fact that the Kepla-Coat treatment, a treatment by a chemical liquid, serving as the pre-treatment for increasing the adhesion can form a more uniform high porosity film than the blast treatment that renders a surface physically rough.

Further, it is confirmed that if the Kepla-Coat layer formed by the Kepla-Coat treatment measures 10 µm in thickness, the adhesion value thereof is greater than the measuring limit (embodiments 1 to 3). This is based on the fact that if the Kepla-Coat layer formed by the Kepla-Coat treatment measures at least 10 µm in thickness, the exposure of the Al alloy of the base material 101 due to the peeling-off of the thermally sprayed film 53 is surely prevented.

Further, the adhesion values of the embodiments 1 to 3 are greater than the measuring limit regardless of whether the blast treatment is performed or not as the pre-treatment. Thus, it is confirmed that the fact whether the blast treatment is performed or not as the pre-treatment almost makes no difference to the adhesion of the thermally sprayed film 53.

By performing the Kepla-Coat treatment as the pre-treatment before the plasma thermal spray treatment, the thermally sprayed film can be formed uniformly even on a part having a complicated configuration, and the surface subjected to the Kepla-Coat treatment is highly porous, so that the adhesion of the thermally sprayed film 53 can be increased. Further, the Kepla-Coat layer is expected to have a same effect as the alumite layer even when the thermally sprayed film 53 is worn away due to plasma erosion.

Further, by uniformly providing a foundation for the thermally sprayed film by way of forming the Kepla-Coat layer on every edge portion, hole, recessed and protruded portion and the like of the plasma treatment container internal member, on which the alumite coating may not be easily formed or is not formed, metal pollution due to plasma erosion of the base material or abnormal electric discharge can be avoided.

INDUSTRIAL APPLICABILITY

As described above in detail, the plasma treatment container internal member of the present invention includes the anodic oxide coating formed on the surface of the base material thereof by way of the anodic oxidation treatment using plasma discharge and the thermally sprayed film formed on the anodic oxide coating. Thus, the adhesivity of the thermally sprayed film to the surface of the base material can be increased because the anodic oxide coating can be formed uniformly on the base material regardless of configuration of the base material.

Further, in accordance with the plasma treatment container internal member of the present invention, the thermally sprayed film is formed of $Al_2O_3$. Thus, plasma resistance of the plasma treatment container internal member can be improved.

Furthermore, in accordance with the plasma treatment container internal member of the present invention, the thermally sprayed film is formed of a compound of a Group 3A element. Thus, the plasma resistance of the plasma treatment container internal member can be improved.

In accordance with the plasma treatment container internal member, the compound of the Group 3A element is $Y_2O_3$. Thus, the plasma resistance of the plasma treatment container internal member can be improved.

Further, in accordance with the plasma treatment container internal member of the present invention, the base material formed of an Al alloy is subjected to the blast treatment as the pre-treatment. Thus, a stable thermally sprayed film can be formed.

Further, a plasma treatment apparatus of the present invention includes the aforementioned plasma treatment container internal member. Thus, the adhesivity of the thermally sprayed film to the surface of the base material of the plasma treatment container internal member can be improved.

What is claimed is:

1. A plasma treatment container internal member disposed in a plasma treatment container for performing process on an object to be treated by plasma, comprising:
    an anodic oxide coating formed on a surface of a base material of the plasma treatment container internal member; and
    a thermally sprayed film formed on the anodic oxide coating and adhering to the anodic oxide coating with an adhesion greater than 40 MPa,
    said anodic oxide coating including a surface region in contact with the thermally sprayed film and an interior region having a porosity less than the surface region,
    wherein the anodic oxide coating is formed by an anodic oxidation treatment using plasma discharge to increase a porosity at a surface of the anodic oxide coating and the anodic oxidation treatment includes the steps of immersing the base material in an alkaline organic electrolyte, and performing the plasma discharge in the alkaline organic electrolyte.

2. The plasma treatment container internal member of claim 1, wherein the thermally sprayed film is formed on the as formed anodic oxide coating.

3. The plasma treatment container internal member of claim 1, wherein the anodic oxide coating is at least 10 μm in thickness.

4. A plasma treatment apparatus, comprising the plasma treatment container internal member of claim 1.

5. The plasma treatment container internal member of claim 1, wherein the thermally sprayed film is formed of a compound of a Group 3 element.

6. The plasma treatment container internal member of claim 5, wherein the compound of the Group 3 element is $Al_2O_3$ or $Y_2O_3$.

7. A plasma treatment container internal member disposed in a plasma treatment container for performing process on an object to be treated by plasma, comprising:
    a thermally sprayed film provided on a surface of a base material of the plasma treatment container internal member,
    an anodic oxide coating including a barrier layer and a ceramic layer,
    wherein the barrier layer and the ceramic layer are consecutively laminated in that order between the base material and the thermally sprayed film,
    the ceramic layer includes a first and a second layer, the first layer formed on the barrier layer and the second layer formed on the first layer, and a porosity of the first layer is lower than that of the second layer,
    the thermally sprayed film adheres to the anodic oxide coating with an adhesion greater than 40 MPa.

8. The plasma treatment container internal member of claim 7, wherein the thermally sprayed film is formed on the as laminated ceramic layer.

9. The plasma treatment container internal member of claim 7, wherein a total thickness of the barrier layer and the ceramic layer is at least 10 μm.

10. A plasma treatment apparatus, comprising the plasma treatment container internal member of claim 7.

11. The plasma treatment container internal member of claim 7, wherein the thermally sprayed film is formed of a compound of a Group 3 element.

12. The plasma treatment container internal member of claim 11, wherein the compound of the Group 3 element is $Al_2O_3$ or $Y_2O_3$.

13. A plasma treatment container internal member comprising:
    an anodic oxide coating formed on a surface of a base material of the plasma treatment container internal member; and
    a thermally sprayed film formed on the anodic oxide coating and adhering to the anodic oxide coating with an adhesion greater than 40 MPa,
    wherein said anodic oxide coating includes a surface region in contact with the thermally sprayed film and an interior region having a porosity less than the surface region.

14. The plasma treatment container internal member of claim 13, wherein the thermally sprayed film is formed of a compound of a Group 3 element.

15. The plasma treatment container internal member of claim 14, wherein the compound of the Group 3 element is $Al_2O_3$ or $Y_2O_3$.

16. A plasma treatment apparatus comprising:
    a plasma treatment container;
    a plasma treatment container internal member disposed in the plasma treatment container;
    a plurality of gas discharge openings through which a processing gas is supplied to the plasma treatment container; and
    an electrode disposed in the plasma treatment container, wherein an object to be treated is adsorbed to be held on an upper surface of the electrode through an electrostatic chuck,
    wherein the plasma treatment container internal member includes;
        a base material;
        an anodic oxide coating formed on a surface of the base material by an anodic oxidation treatment which includes immersing the base material in an alkaline organic electrolyte and performing a plasma discharge in the alkaline organic electrolyte; and
        a thermally sprayed film formed on the anodic oxide coating,
        wherein the thermally sprayed film is adhered to the anodic oxide coating with an adhesion greater than 40 MPa.

17. The plasma treatment apparatus of claim 16, wherein a blast treatment is carried out on the surface of the base material before forming the anodic oxide coating.

18. The plasma treatment apparatus of claim 16, wherein the anodic oxide coating is a Kepla-Coat layer.

19. The plasma treatment apparatus of claim 16, wherein the thermally sprayed film is formed of a compound of a Group 3 element.

20. The plasma treatment apparatus of claim 19, wherein the compound of the Group 3 element is $Al_2O_3$ or $Y_2O_3$.

21. The plasma treatment apparatus of claim 16, wherein the electrode is supported by an elevating column which is lifted and lowered by a driving device.

22. A plasma treatment apparatus comprising:
    a plasma treatment container;
    a plasma treatment container internal member disposed in the plasma treatment container;

a plurality of gas discharge openings through which a processing gas is supplied to the plasma treatment container; and an electrode disposed in the plasma treatment container, wherein an object to be treated is adsorbed to be held on an upper surface of the electrode through an electrostatic chuck, wherein the plasma treatment container internal member includes;

a base material;

an anodic oxide coating formed on a surface of the base material by an anodic oxidation treatment which includes immersing the base material in an alkaline organic electrolyte and performing a plasma discharge in the alkaline organic electrolyte; and a thermally sprayed film formed on the anodic oxide coating, wherein the anodic oxide coating includes a barrier layer, a low porosity ceramic layer and a high porosity ceramic layer, the low porosity ceramic layer and the high porosity ceramic layer being formed on the barrier layer, and wherein the thermally sprayed film is adhered to the anodic oxide coating with an adhesion greater than 40 MPa.

23. The plasma treatment apparatus of claim 22, wherein a blast treatment is carried out on the surface of the base material before forming the anodic oxide coating.

24. The plasma treatment apparatus of claim 22, wherein the thermally sprayed film is formed of a compound of a Group 3 element.

25. The plasma treatment apparatus of claim 22 wherein the compound of the Group 3 element is $Al_2O_3$ or $Y_2O_3$.

26. The plasma treatment apparatus of claim 22, wherein the electrode supported by an elevating column which is lifted and lowered by a driving device.

* * * * *